(12) United States Patent
Hayashi et al.

(10) Patent No.: US 9,419,150 B2
(45) Date of Patent: Aug. 16, 2016

(54) PHOTOSENSOR

(71) Applicant: MITSUBISHI ELECTRIC CORPORATION, Tokyo (JP)

(72) Inventors: Masami Hayashi, Tokyo (JP); Takashi Miyayama, Tokyo (JP); Hiroyuki Murai, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/509,414

(22) Filed: Oct. 8, 2014

(65) Prior Publication Data

US 2015/0021613 A1 Jan. 22, 2015

Related U.S. Application Data

(63) Continuation of application No. 12/115,109, filed on May 5, 2008, now abandoned.

(30) Foreign Application Priority Data

May 14, 2007 (JP) ................................. 2007-127889

(51) Int. Cl.
*G01T 1/24* (2006.01)
*H01L 31/0224* (2006.01)
*H01L 27/146* (2006.01)
*H01L 27/12* (2006.01)

(52) U.S. Cl.
CPC .. *H01L 31/022408* (2013.01); *H01L 27/14603* (2013.01); *H01L 27/14612* (2013.01); *H01L 27/12* (2013.01); *H01L 27/14658* (2013.01)

(58) Field of Classification Search
CPC ....................................................... H01L 27/12
USPC ........................................................... 257/292
See application file for complete search history.

(56) References Cited

U.S. PATENT DOCUMENTS

| 5,075,244 | A | 12/1991 | Sakai et al. |
| 5,399,884 | A | 3/1995 | Wei et al. |
| 5,435,608 | A | 7/1995 | Wei et al. |
| 5,517,031 | A | 5/1996 | Wei et al. |
| 6,437,370 | B1 | 8/2002 | Matsuno |
| 6,462,344 | B1 | 10/2002 | Joo et al. |
| 6,559,506 | B1 * | 5/2003 | Lee ................... H01L 27/14658 257/296 |

(Continued)

FOREIGN PATENT DOCUMENTS

| JP | 4-259257 | 9/1992 |
| JP | 11-337976 | 12/1999 |

(Continued)

OTHER PUBLICATIONS

Richard L. Weisfield, "Large-Area Amorphous Silicon TFT-Based X-Ray Image Sensors for Medical Imaging and Non Destructive Testing", Electrochemical Society Proceedings of the Fourth Symposium on Thin Film Transistor Technologies, 98-22, pp. 369-380, 1998.

(Continued)

*Primary Examiner* — Mark Tornow
(74) *Attorney, Agent, or Firm* — Oblon, McClelland, Maier & Neustadt, L.L.P.

(57) ABSTRACT

For a photosensor, an array substrate is provided, wherein the edge of a photodiode is enclosed by the opening edge of a contact hole formed on a drain electrode.

13 Claims, 11 Drawing Sheets

(56) References Cited

U.S. PATENT DOCUMENTS

| | | |
|---|---|---|
| 6,740,884 B2 | 5/2004 | Lee et al. |
| 8,044,445 B2 | 10/2011 | Hayashi et al. |
| 2002/0145117 A1* | 10/2002 | Mochizuki ........ H01L 27/14658 250/370.09 |
| 2003/0234364 A1 | 12/2003 | Hennessy et al. |
| 2006/0065944 A1* | 3/2006 | Mochizuki ........ H01L 27/14609 257/444 |
| 2009/0152563 A1 | 6/2009 | Hayashi et al. |

FOREIGN PATENT DOCUMENTS

| | | |
|---|---|---|
| JP | 2002-124676 | 4/2002 |
| JP | 2003-158253 | 5/2003 |
| JP | 2004-48000 | 2/2004 |
| JP | 2004-63660 | 2/2004 |
| JP | 2006-189295 | 7/2006 |
| JP | 2006-189296 | 7/2006 |
| JP | 2007-68014 | 3/2007 |

OTHER PUBLICATIONS

Japanese Office Action issued Dec. 4, 2012, in Japan Patent Application No. 2007-127889 (with English translation).

Office Action issued Feb. 19, 2013 in Japanese Application No. 2007-127889 (With English Translation).

* cited by examiner

PHOTOSENSOR

This present divisional application claims the benefit of priority under 35 U.S.C. §120 to application Ser. No. 12/115,109, filed May 5, 2008, and claims the benefit of priority under 35 U.S.C. §119 from Japanese Patent Application No. 2007-127889 filed on May 14, 2007, the entire subject matter of which is incorporated herein by reference.

BACKGROUND OF THE INVENTION

1. Field of the Invention

The present invention relates to a flat-panel photosensor that includes an active matrix type TFT array substrate, on which a photodiode for converting visible light into electric charges and a thin-film transistor (hereinafter referred to as a TFT) employed as a switching element are arranged like a matrix.

2. Description of the Related Art

A flat-panel photosensor that includes a TFT array substrate, on which a photodiode for performing photoelectric conversion of visible light and a TFT are arranged, is applied as a contact image sensor or an X-ray image display apparatus, and is widely employed. Especially, a flat-panel X-ray image display apparatus (hereinafter referred to as an FPD), which is constituted by providing, on a TFT array substrate, a scintillator that converts X rays into visible light, is a favorable apparatus for the application to, for example, a medical industry.

In the X-ray image diagnosis field, observation of a detailed image (still image) and observation of a real-time image (moving picture) are performed for different purposes. An X-ray film is still employed mainly to obtain a still picture, while an image pickup tube (image intensifier) that includes a photomultiplier and a CCD is employed to obtain a moving picture. The X-ray film provides a high spatial resolution, but there are several drawbacks: the X-ray film has a low sensitivity and enables radiographing of only still pictures, and since the developing process is required after radiographing, this is not appropriate for instantaneous use. On the other hand, the image pickup tube provides a high sensitivity and enables radiographing of a moving picture. However, the image pickup tube has a low spatial resolution, and since this is a vacuum device, the increase of the device size is limited.

For an FPD, there are an indirect conversion type that converts X rays into light using a scintillator, such as CsI, and then converts the light into electric charges using a photodiode, and a direct conversion type that directly converts X rays into electric charges using an X-ray detection element, such as Se. The indirect conversion type provides high quantum efficiency and a superior signal/noise ratio, and requires only a small amount of exposure to perform X-ray radiographing and image pickup. The structure of the array substrate of the indirect conversion type FPD and the manufacturing method thereof have been disclosed (see, for example, JP-A-2004-63660 (FIG. 9), JP-A-2004-48000 (FIG. 4) and JP-A-2003-158253 (FIG. 1)).

Formation of a photodiode that influences the sensitivity of a photosensor and noise is important for the array substrate of an FPD. A photosensor includes amorphous silicon layers deposited on an electrode. For example, as in JP-A-2004-63660, when a photosensor is formed on a cathode electrode that includes the same layer as the gate electrode of a thin film transistor, the following problem has risen. Specifically, when a lower electrode 609 of a photodiode is formed of the same material as used for a gate electrode layer, the electrode 609 receives more damage caused by dry etching, or caused by forming a source electrode layer 605 and a drain electrode layer 606, because the electrode 609 is located at the lowermost as well as the gate electrode layer. Accordingly, surface roughness occurs and a leak current from the photodiode is increased. In order to avoid this problem, for example, high-melting-point metal must be employed to form the lower electrode 609 of the photodiode. In this case, an aluminum alloy film having a low resistance can not be employed to form a gate electrode and gate wiring. Further, a margin of an opening size will be reduced for connection between the source electrode layer 605 and the cathode electrode layer 609. In order to avoid this problem, as disclosed in JP-A-2004-48000 or JP-A-2003-158253, the lower electrode for a photosensor might be formed on an electrode that is formed of the same layer as the source electrode and the drain electrode of a thin film transistor.

One of the methods for improving the output performance of the photosensor is a method for increasing the ratio of the dimension of an Si layer, which serves as an photodiode, to the dimension of one sensor component. Therefore, in a conventional structure described in, for example, JP-A-2004-48000 or JP-A-2003-158253, a photodiode encloses a contact hole that is a diode bottom contact opening. That is, the Si layer that constitutes a photodiode is formed to cross the edge of a contact hole. However, in this structure, it is found through our evaluation that, when the opening edge length obtained by adding the lengths of edges, i.e., the circumferential length of the opening of the contact hole was increased, the current leak element was increased. As this reason, we consider that, when a step difference formed by a contact hole is present in a formation area for an Si layer that constitutes a photodiode, the Si layer unevenly grows at the step difference, or a membrane stress is generated in the Si layer at the step difference. Since the increase of a leak current deteriorates the sensitivity of a photosensor, inhibition of a leak current is indispensable.

SUMMARY OF THE INVENTION

A flat-panel photosensor according to this invention includes a TFT array substrate wherein a step difference does not exist in an area where a photodiode formed of Si layers is located above a drain electrode.

A margin for an opening size for connection between a source electrode and a gate electrode need not be considered, and a step difference formed by a contact hole is eliminated in a formation area for Si layers, which constitute a photodiode provided for a photosensor. Thus, an uneven growth of an Si layer at the step difference can be prevented, and the occurrence of a membrane stress at the step difference can be prevented. As a result, a homogeneous Si layer is obtained for a photodiode, and a leak current of a photosensor can be inhibited.

DETAILED DESCRIPTION OF THE PREFERRED EMBODIMENTS (First Embodiment)

Figure 1:
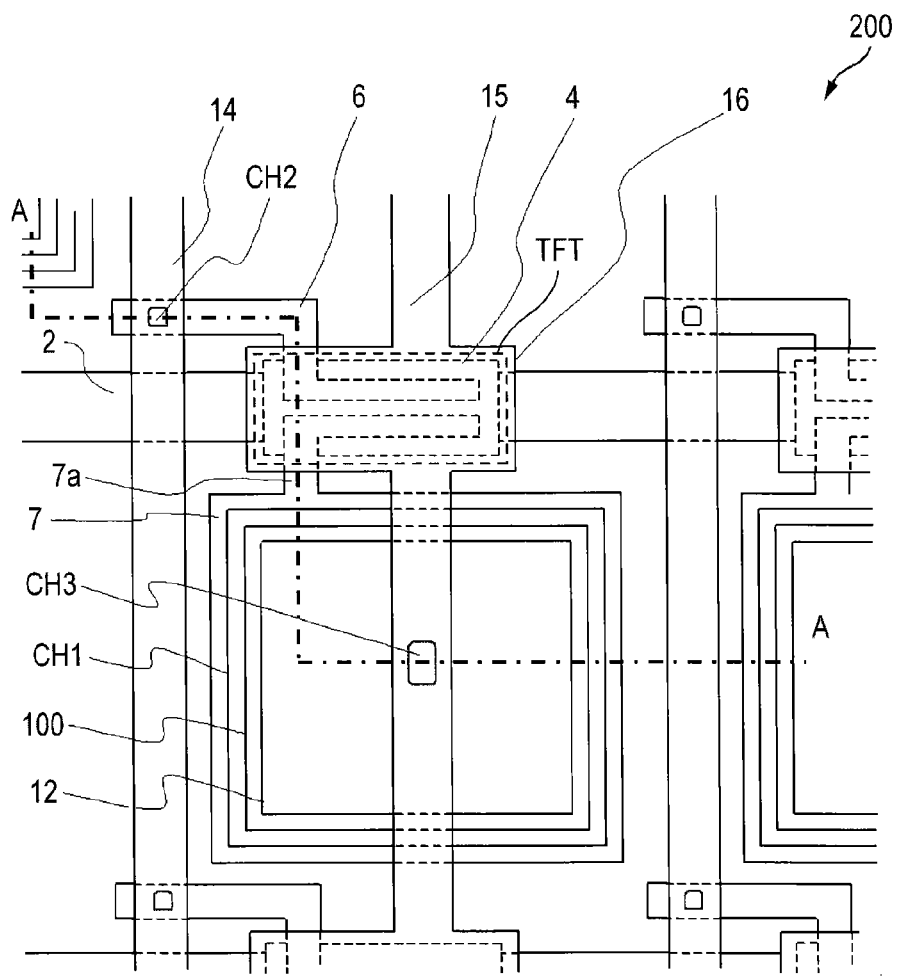
FIG. 1 is a plan view of a TFT array substrate provided for a photosensor according to a first embodiment of the preset invention.
Figure 2:
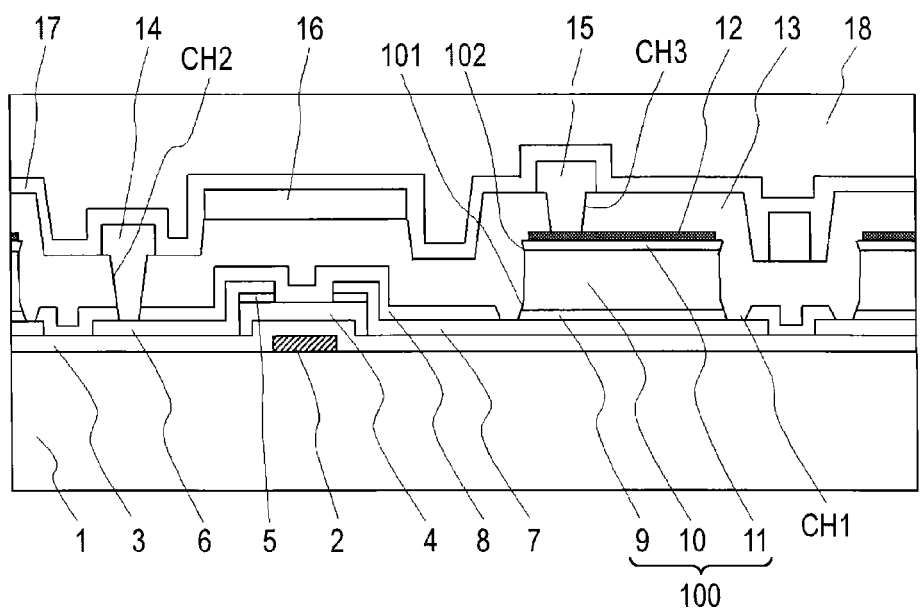
FIG. 2 is a cross-sectional view of the TFT array substrate provided for the photosensor according to the first embodiment.

The preferred embodiments of the present invention will be specifically described while referring to drawings. FIG. 1 is a plan view of a TFT array substrate 200 provided for a photosensor according to a first embodiment of this invention. FIG. 2 is a cross-sectional view of a portion indicated by A-A in FIG. 1.

A gate electrode 2 is made of metal that contains aluminum as the primary element, and is formed on a glass substrate 1 that is an insulating substrate. As metal that contains aluminum as the primary element, an Al alloy that contains Ni, such as AlNiNd, AlNiSi or AlNiMg, i.e., an Al—Ni alloy is employed. However, another aluminum alloy may be employed, or instead of Al, Cu may be employed as a low electrical resistant metal material. Further, the gate electrode 2 may be provided by laminating metal films. A gate insulating film 3 is deposited to cover the gate electrode 2, and a semiconductor layer 4 is formed opposite the gate electrode 2.

An n+a-Si:H ohmic contact layer 5 is formed on the semiconductor layer 4, and a source electrode 6 and a drain electrode 7 are arranged to be connected to the semiconductor layer 4 via the ohmic contact layer 5. In addition, a first passivation film 8 is formed to cover these components.

A P (Phosphorus)-doped amorphous silicon film 9, an intrinsic amorphous silicon film 10 and a B (Boron)-doped amorphous silicon film 11 are laminated in the named order so as to obtain a photodiode 100 having a three-layer structure that is to be connected to the drain electrode 7 via a contact hole CH1 that is open through the first passivation film 8. The photodiode 100 functions as an example of the photosensor. That is, numeral 100 also denotes the photosensor. Incidentally, a phototransistor, a photo IC and a phototube, etc., can be used as the photosensor. On the photodiode 100, a transparent electrode 12 made of IZO, ITZO or ITSO is formed. This embodiment has a feature that the opening of the contact hole CH1 is shaped so as to enclose the photodiode 100. That is, the photodiode 100 is formed inside the opening edge of the contact hole CH1, so that the photodiode 100 does not cross the opening edge of the contact hole CH1. Further, the photodiode 100 is also enclosed inside the pattern for the drain electrode 7. That is, a lower layer of the photodiode 100 is substantially flat. In other words, a step difference is not present in an area where the photodiode 100 is formed. Therefore, since a portion that crosses the opening edge of the contact hole CH1 or the step difference formed by the drain electrode 7 is not present in the amorphous silicon layer lamination of the photodiode 100, a satisfactory photodiode where little current leakage occurs can be obtained. Here, the opening edge indicates a striped portion, around the opening of the contact hole CH1, substantially in a square shown in FIG. 1. When the contact hole CH1 is tapered, the opening edge indicates especially the bottom portion. Furthermore, for the sake of convenience, the portion of the drain electrode 7 that is located between the area on the semiconductor layer 4 and the area to form the photodiode 100 and that couples these areas may be called a connection portion 7a.

A second passivation film 13 having contact holes CH2 and CH3 is deposited to cover the above described structure. A data line 14 on the second passivation film 13 is connected to the source electrode 6 via the contact hole CH2, and a bias line 15 on the second passivation film 13 is connected via the contact hole CH3 to the transparent electrode 12. An Al—Ni alloy film is applied at least to the topmost layers or the lowermost layers of the data line 14 and the bias line 15. Only a single layer of an Al—Ni alloy film may be applied for the data line 14 and the bias line 15. When an Al—Ni alloy film is employed as the topmost layer, a nitride layer may be additionally deposited on the surface. Furthermore, although not shown, the data line 14 is used as wiring to read an electric charge obtained through conversion by the photodiode 100 that has a three-layer structure. The bias line 15 is wiring used to apply a reverse bias to the photodiode 100, so that the photodiode 100 is set to the OFF state when it is not exposed to light. A light blocking layer 16 is also formed on the second passivation film 13. A third passivation film 17 and a fourth passivation film 18 are deposited to cover the above described components. The fourth passivation film 18 is a film having a flat surface, and is made of, for example, an organic resin.

Figure 3:
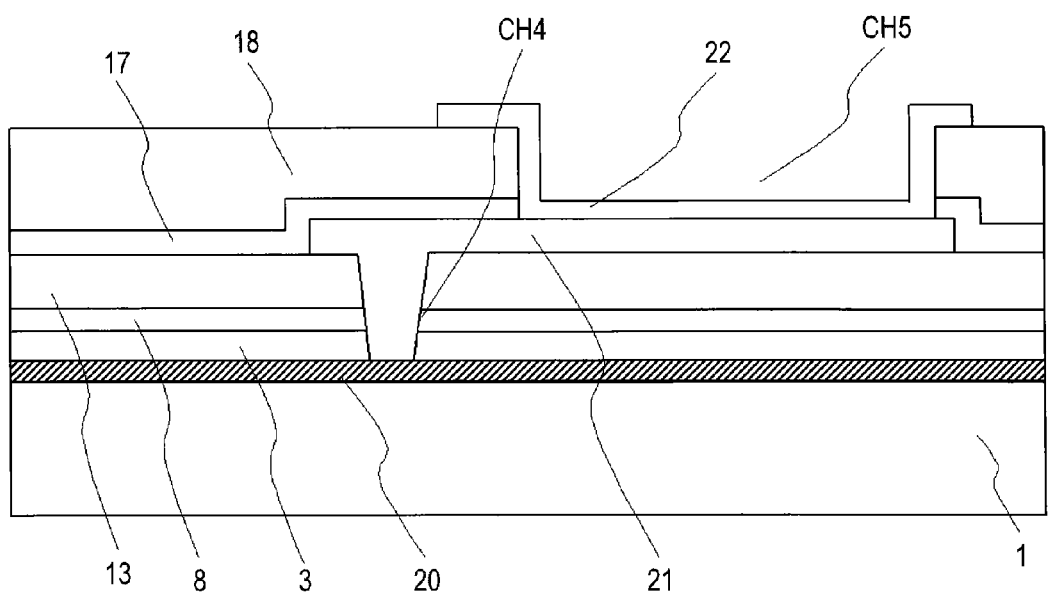
FIG. 3 is a cross-sectional view of a terminal portion according to the first embodiment.
Figure 4:
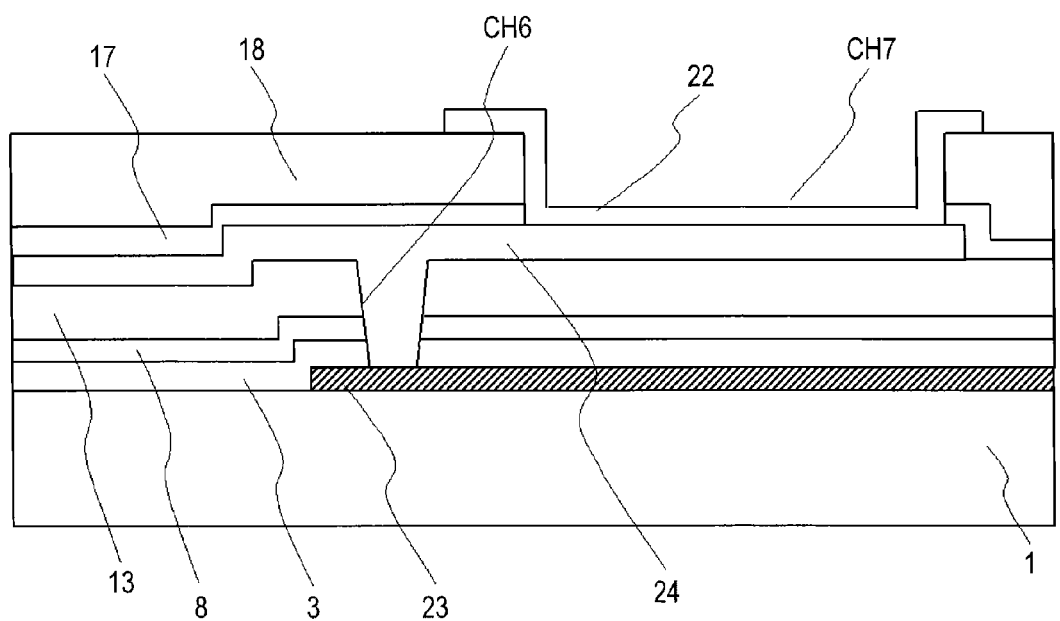
FIG. 4 is a cross-sectional view of a terminal portion according to the first embodiment.

Terminal portions will now be described while referring to FIGS. 3 and 4. FIG. 3 is a cross-sectional view of a terminal portion formed at the end of gate wiring that is extended from the gate electrode 2. FIG. 4 is a cross-sectional view of a terminal portion formed at the end of wiring that is extended from the data line 14 or the bias line 15.

Referring to FIG. 3, a gate wiring end portion 20 is formed on the glass substrate 1, at the same time as the gate electrode 2 is formed. The gate insulating film 3, the first passivation film 8 and the second passivation film 13 are laminated on the gate wiring end portion 20, and on the lamination, a conductive pattern 21 is overlaid at the same time as the data line 14 is formed. The conductive pattern 21 is connected via a contact hole CH4 to the gate wiring end portion 20. The contact hole CH4 may be formed in the same etching process as for the contact holes CH2 and CH3. Further, since the contact hole CH4 is formed in a tapered shape, step coverage of the conductive pattern 21 is increased, and a wire break can be prevented.

Furthermore, a third passivation film 17 and a fourth passivation film 18 are deposited on the conductive pattern 21, and a terminal lead electrode 22 is formed on the third passivation film 17 and the fourth passivation film 18. The terminal lead electrode 22 and the conductive pattern 21 are connected together via a contact hole CH5 that is open through the third passivation film 17 and the fourth passivation film 18. In this embodiment, the terminal lead electrode 22 is made of a transparent conductive oxide; however, a film lamination where a high-melting-point metal film is deposited as a lower layer may be employed.

Referring to FIG. 4, short ring wiring 23 is formed on the glass substrate 1 at the same time as the gate electrode 2 is formed. The gate insulating film 3, the first passivation film 8 and the second passivation film 13 are laminated on the short ring wiring 23, and a wiring end portion 24, extended from the data line 14 or the data line 15, is arranged on the lamination. The wiring end portion 24 is connected to the short ring wiring 23 via a contact hole CH6. The contact hole CH6 may be formed in the same etching process as for the contact holes CH2 and CH3. When the contact hole CH6 is formed in a tapered shape, step coverage of the wiring end portion 24 can be increased, and a wire break can be prevented.

In addition, the third passivation film 17 and the fourth passivation film 18 are deposited on the wiring end portion 24, and the terminal lead electrode 22 is formed on the third passivation film 17 and the fourth passivation film 18. The terminal lead electrode 22 and the wiring end portion 24 are connected together via a contact hole CH7 that is open through the third passivation film 17 and the fourth passivation film 18. It should be noted that the terminal lead electrode 22 may also be a lamination of an upper layer of a transparent conductive oxide and a lower layer of a high-melting-point metal.

Figure 19:
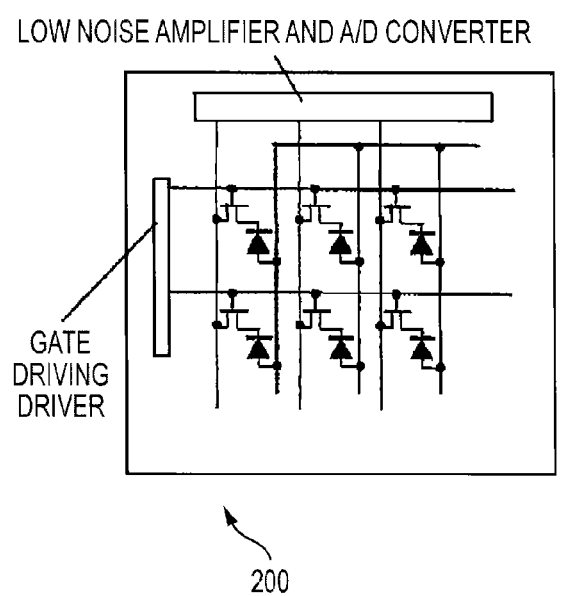
FIG. 19 is a plan view showing a general configuration of the TFT array substrate according to the invention.
Figure 20:
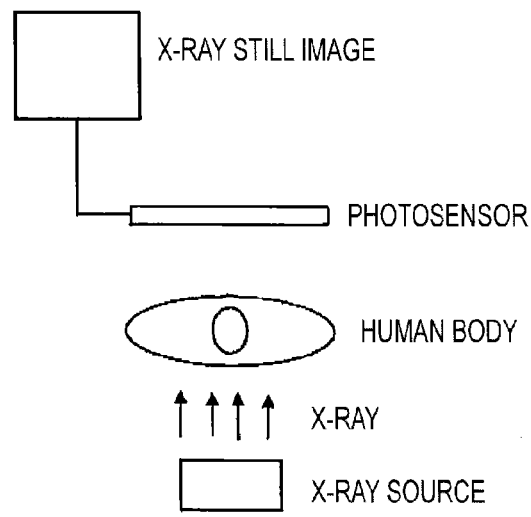
FIG. 20 shows a general configuration of an X-ray image pickup apparatus according to the invention.

Using a TFT array substrate 200 shown in FIGS. 1 and 2, a photosensor, such as an X-ray image pickup apparatus as shown in FIG. 20, can also be manufactured by a well known method. Although not shown, for production of an X-ray image pickup apparatus, a scintillator, such as a CsI, that converts X rays into visible light is formed on the fourth passivation film 18 in FIG. 1 by performing vapor deposition. Then, a digital board on which a low noise amplifier and an A/D converter are mounted, a driver board that drives a TFT and a reading board that reads electric charges are connected to the photosensor as shown in FIG. 19. In this manner, an X-ray image pickup apparatus can be prepared.

In the TFT array substrate provided for the photosensor of this embodiment, a step difference formed by a contact hole can be eliminated in the formation area for Si layers that constitute a photodiode. Therefore, an uneven growth of the Si film at the step difference can be removed, and a membrane stress at the step difference can be prevented. Thus, a homogenous Si layer that constitutes a photodiode is obtained, and a leak current can be inhibited. Further, for the TFT array substrate provided for the photosensor of this embodiment, when the source electrode and the drain electrode of the thin film transistor and the lower electrode for a photodiode are to be formed, a pattern for the same layer as the gate wiring is not exposed. Thus, a low electrical resistant metal alloy, such as aluminum or copper, can be employed to form gate wiring, and a large photosensor can be produced.

Figure 5A:
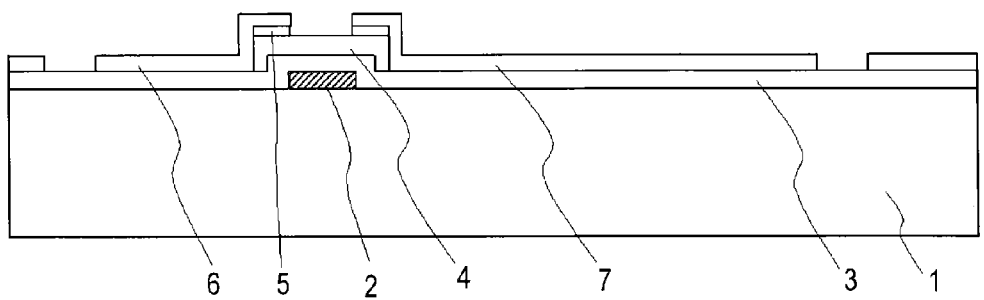
FIGS. 5A to 5C are cross-sectional views of the TFT array substrate provided for the photosensor according to the first embodiment.
Figure 5B:
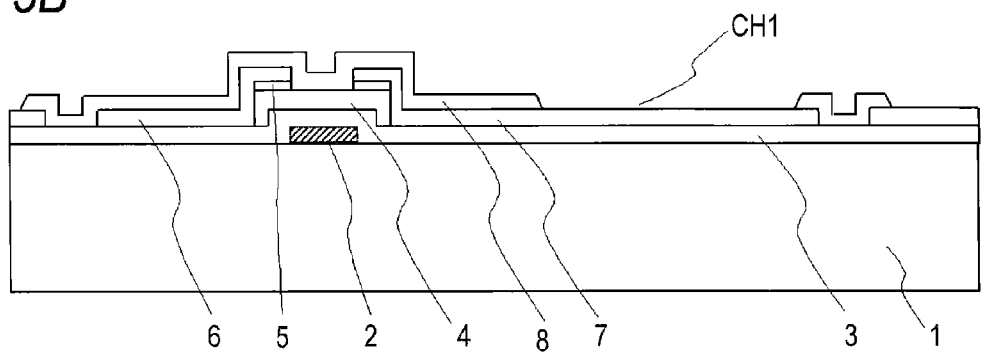
Figure 5C:
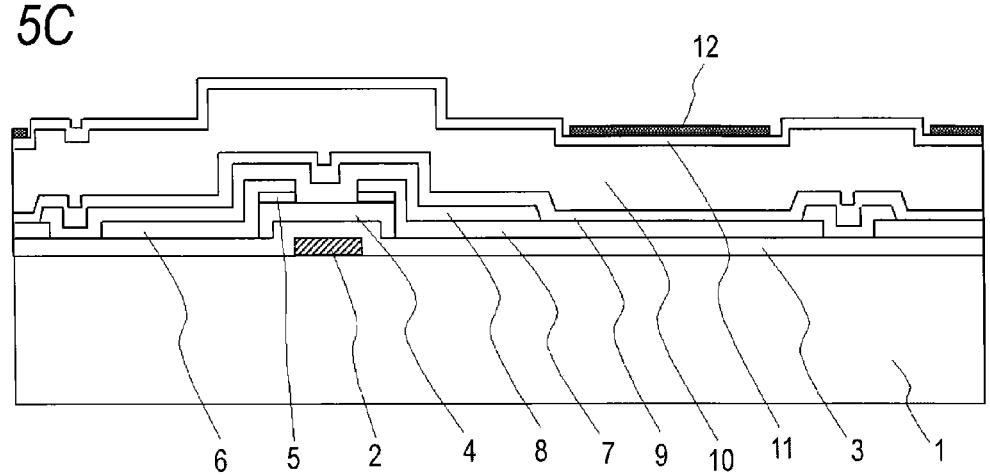
Figure 6A:
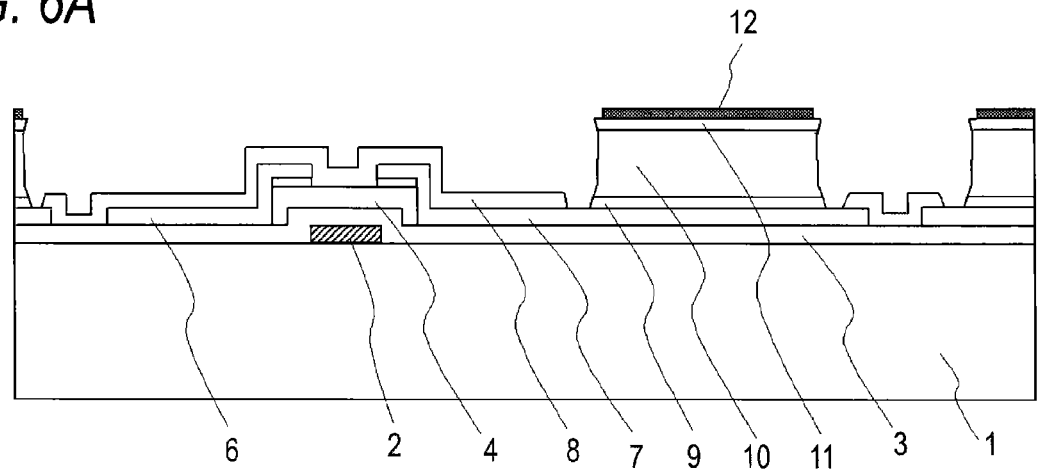
FIGS. 6A and 6B are cross-sectional views of the TFT array substrate provided for the photosensor according to the first embodiment.
Figure 6B:
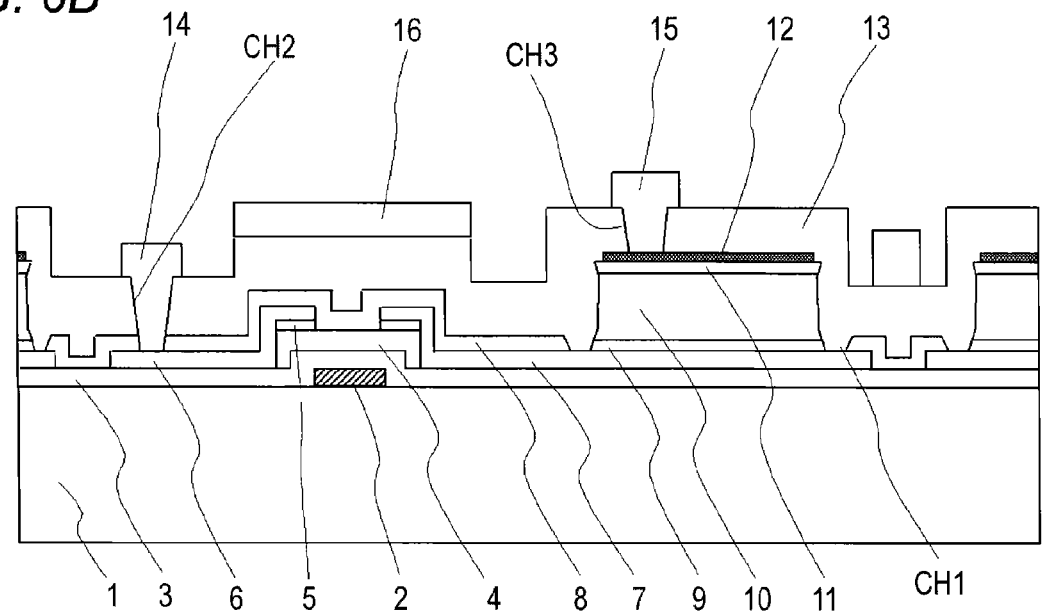

A method for manufacturing the TFT array substrate provided for the photosensor of this embodiment will now be described while referring to FIGS. 5A to 5C and FIGS. 6A and 6B. FIGS. 5 and 6 are cross-sectional views of the portion shown in FIG. 2 at the individual steps of the manufacturing processing.

First, the first conductive thin film is deposited on the glass substrate 1, by sputtering, using metal that employs aluminum as the primary element, e.g., an Al alloy, such as AlNiNd, that contains Ni. The film deposition condition is pressure of 0.2 to 0.5 Pa, DC power of 1.0 to 2.5 kW or a power density of 0.17 to 0.43 W/cm$^2$ and a film deposition temperature ranging from a room temperature to about 180° C. The film thickness is 150 to 300 nm. Further, in order to prevent a reaction to a developer, an AlNiNdN layer may be deposited on the AlNiNd layer. Instead of AlNiNd, AlNiSi or AlNiMg may be employed. And the same material may be employed also for the data line 14 and the bias line 15, and in this case, the production efficiency will be increased. In addition to Al, Cu or a Cu alloy can be employed as a low electrical resistant metal material, and as well as for Al, the sputtering method can be employed. These metal films may also be laminated.

Sequentially, at the first photolithography step, a resist in a gate electrode shape is formed, and at the etching step, the first conductive thin film is patterned using a mixture of, for example, phosphoric acid, nitric acid and acetic acid to obtain the gate electrode 2. When the cross section of the gate electrode 2 is tapered, the occurrence of a defect, such as a wire break, can be reduced in the succeeding film deposition process. In this embodiment, the mixture of phosphoric acid, nitric acid and acetic acid is employed for etching; however, an etchant is not limited to this type, and dry etching may also be performed. According to the structure of this embodiment, since the gate electrode 2 is not exposed during the photodiode formation process, even a metal that contains, as the primary element, aluminum or copper that is less durable to a damage can be employed as the gate electrode 2. Therefore, since low electrical resistant wiring can be formed, a large photosensor can be obtained.

Following this, the gate insulating film 3 of 200 to 400 nm thick, the a-Si:H (amorphous silicon with a hydrogen atom being added) semiconductor layer 4 of 100 to 200 nm thick and the n+a-Si:H ohmic contact layer 5 of 20 to 50 nm thick are laminated by a plasma CVD method. Since high efficiency for reading an electric charge and a transistor that exhibits a high drive performance are required for the photosensor, the a-Si:H semiconductor layer 4 may be formed in two processes in order to increase the performance of the transistor. As the film deposition condition in this case, a low deposition rate of 50 to 200 [Å]/minute is employed to form the first high-quality layer, and the deposition rate of 300 [Å]/minute or higher is employed for the other following layers. In addition, the deposition temperature of 250 to 350° C. is employed to form the gate insulating film 3, the a-Si:H (amorphous silicon with a hydrogen atom being added) semiconductor layer 4 and the n+a-Si:H ohmic contact layer 5.

Next, at the second photolithography step, a resist in a channel shape is formed, and at the etching step, the semiconductor layer 4 and the ohmic contact layer 5 are patterned with an island shape so as to maintain a portion that forms a channel. In this process, plasma etching is performed using, for example, a gas mixture of $SF_6$ and HCl. When the cross section of a channel is tapered, the occurrence of a defect, such as a wire break, can be reduced in the succeeding film formation process. In this embodiment, a gas mixture of $SF_6$ and HCl is employed as an etching gas; however, the type of gas is not limited to this.

Thereafter, deposition of the second conductive thin film is performed. In this process, a high-melting-point metal film, such as Cr, is deposited using, for example, the sputtering method. The film thickness is 50 to 300 nm.

Sequentially, at the third photolithography step, a resist (not shown) corresponding to a source electrode and a drain electrode is formed, and at the etching step, the second conductive thin film is patterned using, for example, a mixture of cerium ammonium nitrate and nitric acid, and the source electrode 6 and the drain electrode 7 are obtained. Thereafter, the ohmic contact layer 5 is etched using these electrodes 6 and 7 as masks and by plasma that employs a gas mixture of, for example, $SF_6$ and HCl. As a result, a thin film transistor (TFT) is formed.

Three masks have been employed up to this process. However, at the second and third photolithography steps for forming a silicon island and for forming the source electrode 6, the drain electrode 7 and the ohmic contact layer 5, a method for employing only one gray tone mask to perform the processing may be employed. Further, a mixture of cerium ammonium nitrate and nitric acid has been employed as an etchant to form the source electrode 6 and the drain electrode 7, and a gas mixture of $SF_6$ and HCl has been used as an etching gas for the ohmic contact layer 5. However, gases to be employed are not limited to these examples. Furthermore, in this embodiment, Cr has been employed; however, instead of Cr, other metal that can obtain an ohmic contact with Si can be employed. The cross section in this state is shown in FIG. 5A. For improving the characteristic of the thin film transistor (TFT), prior to formation of the passivation film 8, the plasma treatment using a hydrogen gas may be performed for this structure so as to roughen the back channel side, i.e., the surface of the semiconductor layer 4.

Following this, the first passivation film 8 is formed by a method, such as plasma CVD, and at the fourth photolithography step, the contact hole CH1 is formed using a resist (not shown) in order to obtain a contact between the drain electrode 7 and the P-doped amorphous silicon film 9. In this process, the first passivation film 8 is patterned through plasma etching using a gas mixture of, for example, $CF_4$ and $O_2$. The cross section in this state is shown in FIG. 5B.

As the first passivation film 8, a silicon oxide ($SiO_2$) film having a low permittivity is formed with a thickness of 200 to 400 nm. The film deposition condition of a silicon oxide film is an $SiH_4$ flow rate of 10 to 50 sccm, an $N_2O$ flow rate of 200 to 500 sccm, a film deposition pressure of 50 Pa, RF power of 50 to 200 W or a power density of 0.015 to 0.67 $W/cm^2$, and a film deposition temperature of 200 to 300° C. In this embodiment, a gas mixture of $CF_4$ and $O_2$ is employed; however, an etching gas is not limited to this. Further, silicon oxide is employed for the first passivation film 8; however, a material is not limited to this, and SiN or SiON may be employed. In this case, hydrogen, nitrogen or $NH_3$ is added to the above described etching gas to form the first passivation film 8. At the fourth photolithography step, the opening edge of the contact hole CH1 is formed using a mask that is located outside the edge of an area where the drain electrode 7 and the photodiode 100 are connected together.

By using the plasma CVD method, the P-doped amorphous silicon film 9, the intrinsic amorphous silicon film 10 and the B-doped amorphous silicon film 11, which constitute the photodiode 100, are laminated in the named order in the same deposition chamber, while the vacuum state is maintained. Of the obtained silicon film lamination, the P-doped amorphous silicon film 9 is 30 to 80 nm thick, the intrinsic amorphous silicon film 10 is 0.5 to 2.0 μm thick and the B-doped amorphous silicon film 11 is 30 to 80 nm thick. As the deposition condition of the intrinsic amorphous silicon film 10, for example, the $SiH_4$ flow rate is 100 to 200 sccm, the $H_2$ flow rate is 100 to 300 sccm, the film deposition pressure is 100 to 300 Pa, the RF power is 30 to 150 W or the power density is 0.01 to 0.05 $W/cm^2$, and the film deposition temperature is 200 to 300° C. For depositing the P-doped or B-doped silicon film 9 or 11, a gas obtained by mixing 0.2 to 1.0% of $PH_3$ or $B_2H_6$ with the gas that conforms the above described deposition condition is employed.

The B-doped amorphous silicon film 11 may be formed by implanting B to the upper portion of the intrinsic amorphous silicon film 10 using the ion shower doping method or the ion implantation method. When the ion implantation method is employed to form the B-doped amorphous silicon film 11, an $SiO_2$ film of 5 to 40 nm may be formed in advance on the surface of the intrinsic amorphous silicon film 10. This is because a damage due to implantation of B is reduced. In this case, after ion is implanted, the $SiO_2$ film may be removed using, for example, BHF.

Next, an amorphous transparent conductive film is deposited, by sputtering, using one of targets, IZO, ITZO and ITSO. The film deposition condition is 0.3 to 0.6 Pa, DC power of 3 to 10 kW or a power density of 0.65 to 2.3 $W/cm^2$, an Ar flow rate of 50 to 150 sccm, an oxygen flow rate of 1 to 2 sccm and a film deposition temperature ranging from a room temperature to about 180° C. After the amorphous transparent conductive film has been formed, at the fifth photolithography step, a resist (not shown) is formed and is etched using oxalic acid to perform patterning, and the transparent electrode 12 is obtained. The cross section in this state is shown in FIG. 5C.

Oxalic acid has been employed for etching; however, an etchant is not limited to this. In this embodiment, since a film that contains either IZO, ITZO or ITSO is employed as the transparent electrode 12, the film deposition process can be performed under an amorphous state in which tiny crystal grains are almost not included in the underneath B-doped amorphous silicon film 11. Therefore, this method provides effects that little etch residue remains. Further, a film that contains a mixture of the above described materials may be employed as the transparent electrode 12, or films formed of the individual materials or films formed of a mixture of these materials may be laminated.

Sequentially, at the sixth photolithography step, a resist pattern is formed so as to be a little larger than the pattern of the transparent electrode 12 and to be located inside the opening edge of the contact hole CH1. Then, the three amorphous silicon layers, i.e., the P-doped amorphous silicon film 9, the intrinsic amorphous silicon film 10 and the B-doped amorphous silicon film 11 are patterned using plasma of a gas mixture of, for example, $SF_6$ and HCl. The gas mixture of $SF_6$ and HCl has been employed for etching; however, an etching gas is not limited to this. As a result, the photodiode 100 having a three-layer structure is obtained. The cross section in this state is shown in FIG. 6A.

The photodiode 100 that includes three layers, i.e., the P-doped amorphous silicon film 9, the intrinsic amorphous silicon film 10 and the B-doped amorphous silicon film 11, and is arranged inside the opening edge of the contact hole CH1. Therefore, the photodiode 100 is located also inside the pattern end for the drain electrode 7. According to this arrangement, since the photodiode 100 does not cross the opening edge of the contact hole CH1 or the pattern end of the drain electrode 7, the increase of a leak current due to a step difference can be inhibited. That is, an uneven growth of the Si film at the step difference can be eliminated, and the occurrence of a membrane stress due to the step difference can be prevented. Further, the Si layers that constitute the photodiode become homogenous, and the increase of a leak current due to the step difference at the opening edge can be inhibited.

Next, the second passivation film 13 for protecting the photodiode 100 is formed, and at the seventh photolithography step, a resist pattern (not shown) is formed in correspondence with the contact hole CH2, via which the source electrode 6 connects to the data line 14, and the contact hole CH3, via which the transparent electrode 12 of the photodiode 100 connects to the bias line 15. Thereafter, the resist is patterned with the contact holes CH2 and CH3 using plasma of a gas mixture of $CF_4$ and Ar. At this time, the contact hole CH4 that connects the gate wiring end portion 20 to the conductive pattern 21 and the contact hole CH6 may also be formed.

As the second passivation film 13, a silicon oxide film having a low permittivity is deposited with a thickness of 0.5 to 1.5 μm in order to reduce a load capacitance imposed on the data line 14 and the bias line 15. The film deposition condition for the silicon oxide film is an $SiH_4$ flow rate of 10 to 50 sccm, an $N_2O$ flow rate of 200 to 500 sccm, a film deposition pressure of 50 Pa, RF power of 50 to 200 W or a power density of 0.015 to 0.67 $W/cm^2$ and a film deposition temperature of 200 to 300° C. Silicon oxide has been employed as the material for the second passivation film 13; however, the material is not limited to this, and SiN, for example, may be employed. When the contact holes are formed so as to have a tapered shape in cross section, step coverage of the upper layer is increased and the occurrence of a wire break, for example, can be reduced.

Furthermore, in this embodiment, the manufacturing method for forming the second passivation film 13 and then opening the contact holes CH2 and CH3 has been described. However, the manufacturing method is not limited to this. For example, at the same time as the contact hole CH1 is formed, openings may be formed in advance at positions corresponding to the contact hole CH2 and the contact holes CH4 and CH6. In this case, since the first passivation film 8 is not required, the etching period required for forming the openings after the second passivation film 13 has been deposited can be reduced.

Following this, the third conductive thin film is deposited in order to obtain the data line 14, the bias line 15 and the light blocking layer 16. For the third conductive thin film, an Al alloy containing Ni, such as AlNiNd, that has a low resistance and a superior heat resistance and exhibits a superior contact property relative to a transparent conductive thin film is employed, and is formed with a thickness of 0.5 to 1.5 μm. The data line 14 and the bias line 15 may be provided as a single AlNiNd layer, a lamination of AlNiNd and Mo or an Mo alloy, or a lamination of AlNiNd and a high-melting-point metal, such as Cr. Further, in order to prevent a reaction against a developer, an AlNiNdN film may be deposited on the AlNiNd film. In this case, by sputtering, an Mo alloy is formed as an underlayer and AlNiNd is overlaid. The film deposition condition is pressure of 0.2 to 0.5 Pa, DC power of 1.0 to 2.5 kW or a power density of 0.17 to 0.43 $W/cm^2$ and a film deposition temperature ranging from a room temperature to about 180° C.

At the eighth photolithography step, a resist is formed in correspondence with the data line 14, the bias line 15 and the light blocking layer 16, and when the resist is made of an AlNiNd and Mo laminated film, patterning is performed using a mixture of, for example, phosphoric acid, nitric acid and acetic acid. The cross section in this state is shown in FIG. 6B. In this embodiment, the mixture of phosphoric acid, nitric acid and acetic acid is employed for etching; however, an etchant is not limited to this type. The data line 14 is connected via the contact hole CH2 to the source electrode 6, and the bias line 15 is connected via the contact hole CH3 to the transparent electrode 12. Since, as previously described, an Al alloy containing Ni or a high-melting-point metal is employed as the lowermost layer of the bias line 15, the contact resistance relative to the lower transparent electrode 12 is low, and a satisfactory connection can be obtained.

Next, the third passivation film 17 and the fourth passivation film 18 are deposited to protect the data line 14 and the bias line 15. In this embodiment, for example, SiN is employed for the third passivation film 17, and a planarization film is employed as the fourth passivation film 18.

At the ninth photolithography step, the contact holes CH5 and CH7 to connect terminals are formed using a resist, and patterning is performed using plasma of a gas mixture of $CF_4$ and $O_2$. In this embodiment, a gas mixture of $CF_4$ and $O_2$ is employed for etching; however, an etching gas is not limited to this. It should be noted that, when a photosensitive planarization film is employed as the fourth passivation film 18, an exposure and developing process may be performed to pattern the fourth passivation film 18 at the ninth photolithography step.

Following this, a transparent conductive film that serves as the terminal lead electrode 22 is formed. An electrode material, such as amorphous ITO, is employed in order to obtain reliability. Then, at the tenth photolithography step, a resist in a terminal shape is formed, and is etched using, for example, oxalic acid to obtain the terminal lead electrode 22. Thereafter, ITO is crystallized by annealing. At this time, as shown in FIGS. 3 and 4, the terminal lead electrode 22 is connected via the contact holes CH5 and CH7 to the conductive pattern 21 and the wiring end portion 24.

Figure 7:
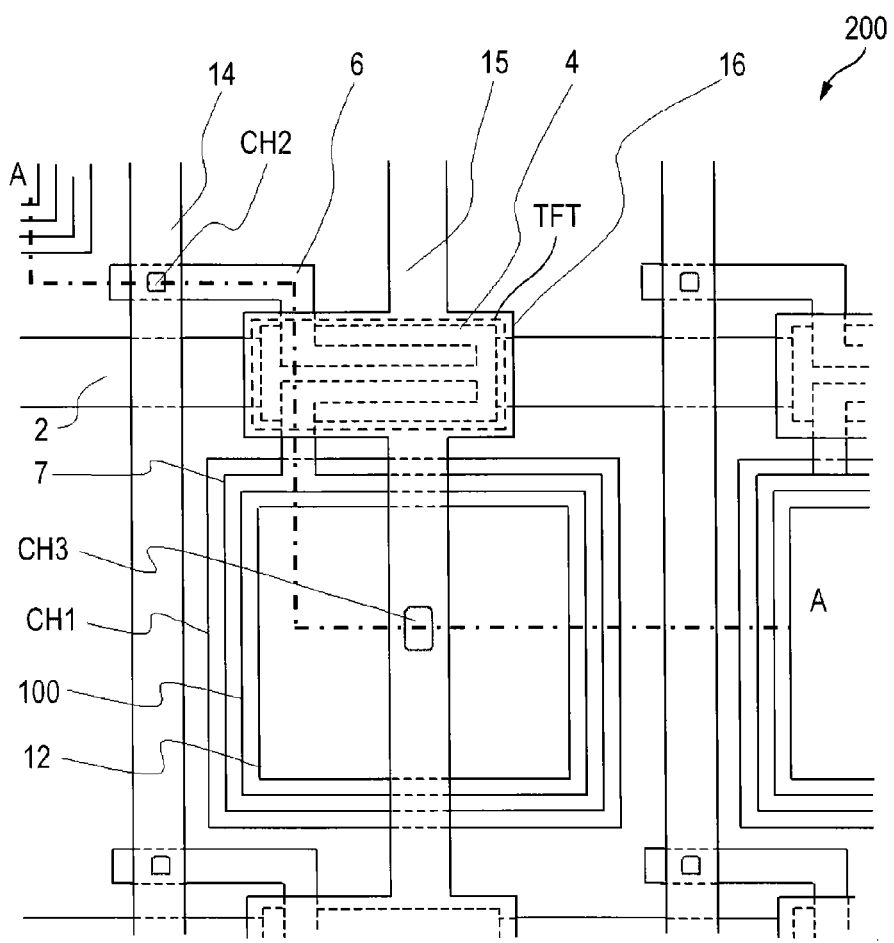
FIG. 7 is a plan view of a TFT array substrate in a different example for the first embodiment.
Figure 8:
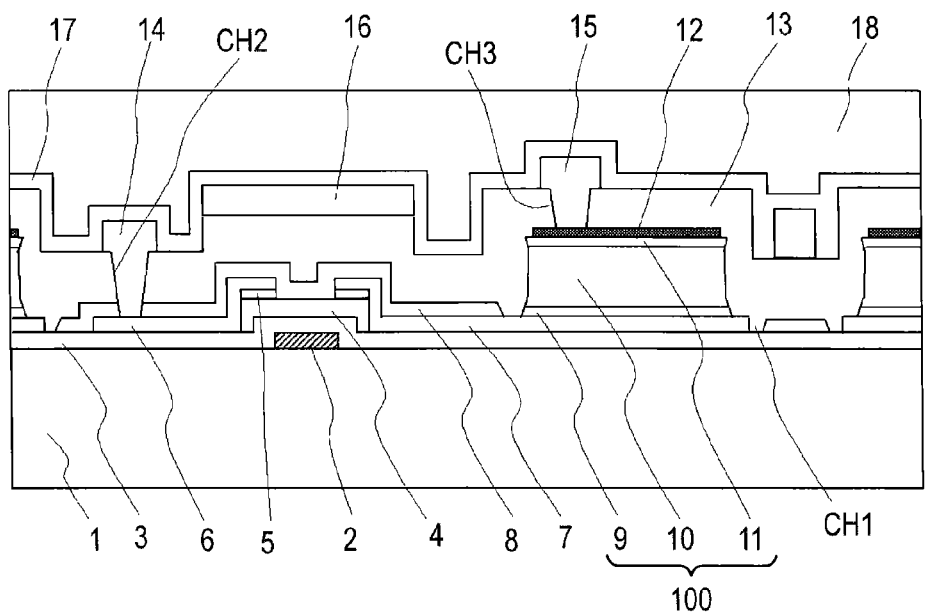
FIG. 8 is a cross-sectional view of the TFT array substrate in the different example for the first embodiment.

In this embodiment, as shown in FIG. 1 and FIG. 5B, the opening edge of the contact hole CH1 is enclosed by the pattern end of the drain electrode 7. However, this positional relation may be reversed. The plan view and the cross-sectional view of a TFT array substrate 200 having a reverse arrangement are shown in FIGS. 7 and 8. FIG. 8 is a cross-sectional view of the portion indicated by A-A in FIG. 7.

Referring to FIGS. 7 and 8, the drain electrode 7 is enclosed by the opening edge of the contact hole CH1. In this case as well as in the above example, the photodiode 100 that includes the P-doped amorphous silicon film 9, the intrinsic amorphous silicon film 10 and the B-doped amorphous silicon film 11 is arranged so as not to cross the step difference at the contact hole CH1 or the drain electrode 7. Therefore, the effects of the present invention can also be obtained. Since the manufacturing method is almost the same as the contents described above, except for the size of a mask used when the contact hole CH1 is formed, no further explanation for this will be given. It is preferable, however, that the etching process for opening the contact hole CH1 be performed under an etching condition that provides etch selectivity for the gate insulating film 3 located underneath.

(Second Embodiment)

In the first embodiment, depending on an etching condition, there is a case wherein, in the processing for forming the contact hole CH1 that connects the drain electrode 7, which serves as the lower electrode for the photodiode 100, to the amorphous silicon film 9, a polymer may be generated by the element of an etching gas and be attached again to the drain electrode 7. In this state, when the P-doped amorphous silicon film 9, the intrinsic amorphous silicon film 10 and the B-doped amorphous silicon film 11 are deposited to constitute the photodiode 100, the adhesion to the drain electrode 7 is deteriorated and the amorphous silicon film might peel off.

Figure 9:
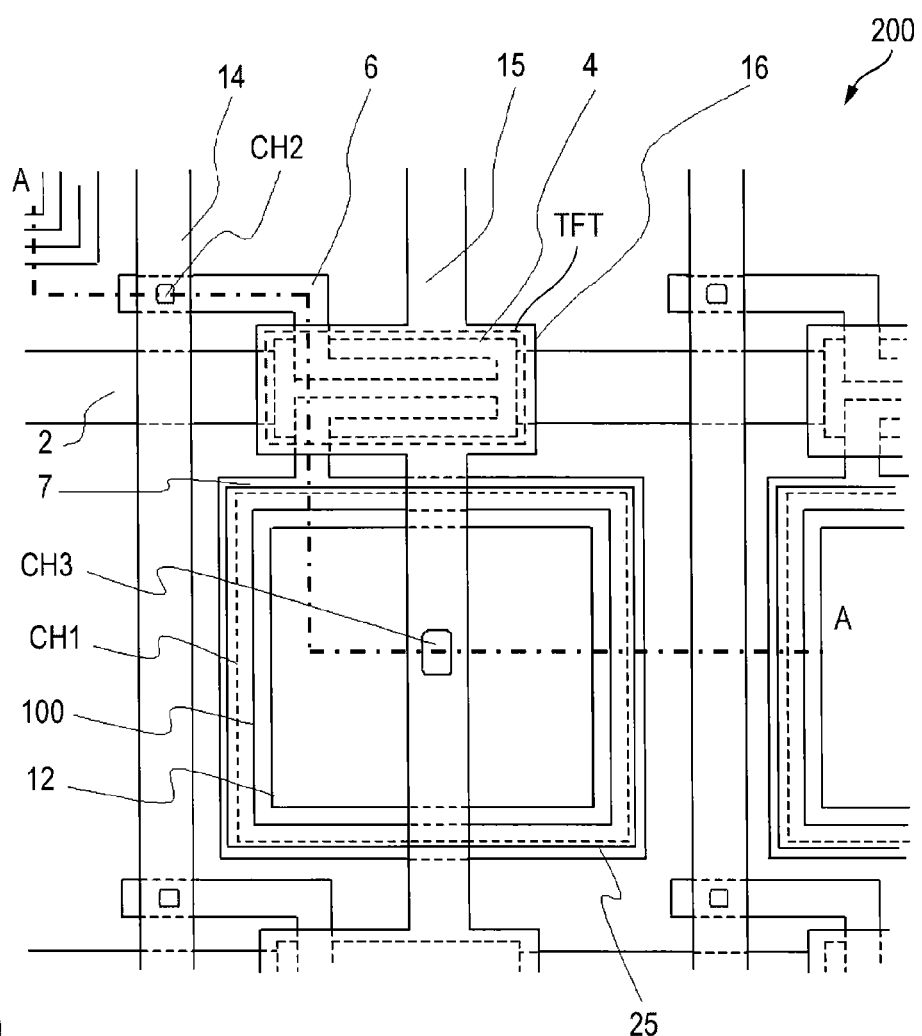
FIG. 9 is a plan view of a TFT array substrate provided for a photosensor according to a second embodiment of the preset invention.
Figure 10:
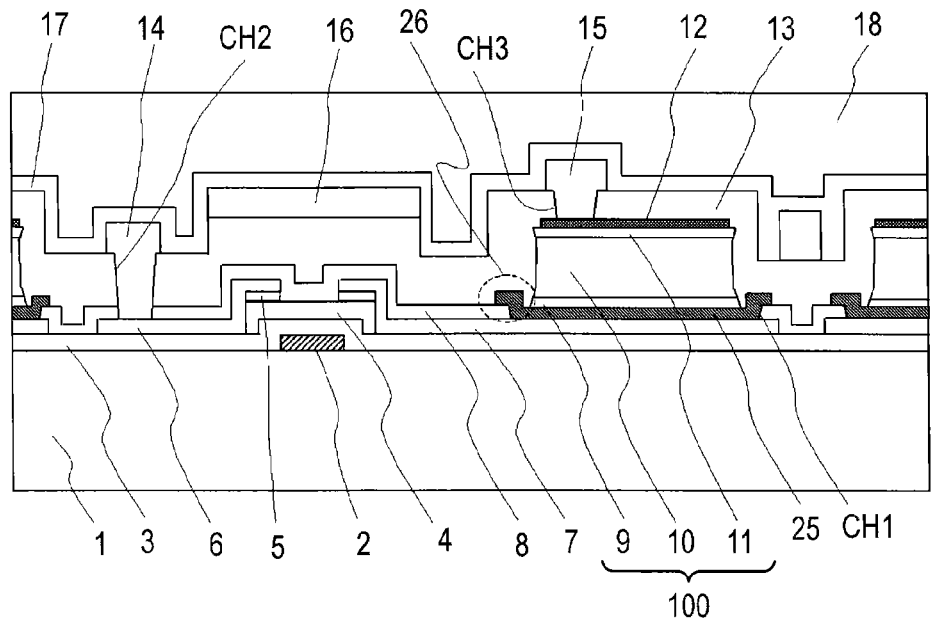
FIG. 10 is a cross-sectional view of the TFT array substrate provided for the photosensor according to the second embodiment.

According to a second embodiment of the present invention, a leak current of a photodiode 100 is inhibited, and an amorphous silicon film is prevented from peeling off. This embodiment will now be described while referring to FIGS. 9 and 10. FIG. 9 is a plan view of a TFT array substrate 200 provided for a photosensor for the second embodiment. FIG. 10 is a cross-sectional view of a portion indicated by A-A in FIG. 9. In FIG. 9, a contact hole CH1 is indicated by a broken line so as to clearly identify.

As apparent from FIGS. 9 and 10, the feature of the second embodiment is that a lower electrode 25 for the photodiode 100 is formed to cover the contact hole CH1 and the photodiode 100 is overlaid so as to be connected to the lower electrode 25. That is, the photodiode 100 is connected via the lower electrode 25 to a drain electrode 7. Further, as the other feature, the photodiode 100 is located near the opening edge of the contact hole CH1 so as not to cross a portion where the lower electrode 25 covers a passivation film 8 (a portion 26 indicated by a broken line in FIG. 10). Therefore, as well as in the first embodiment, since laminated amorphous silicon layers that constitute the photodiode 100 do not include a portion that crosses the step difference, the satisfactory photodiode 100 having little current leakage can be obtained.

A manufacturing method will now be described. Since the same method as in the first embodiment is employed until the contact hole CH1 is formed at the fourth photolithography step, no further explanation for this will be given. In the second embodiment, after the contact hole CH1 has been formed, deposition of the fourth conductive thin film that becomes the lower electrode 25 for the photodiode 100 is performed. In this process, a high-melting-point metal, such as Cr, is deposited by, for example, sputtering.

Sequentially, at the photolithography step, the lower electrode 25 for the photodiode 100 is formed to cover the contact hole CH1, and then, a P-doped amorphous silicon film 9, an intrinsic amorphous silicon film 10 and a B-doped amorphous silicon film 11 are deposited. Since the lower electrode 25 is formed after the contact hole CH1 was open, and since surface contamination is rarely left over on the lower electrode 25 and satisfactory adhesion to the amorphous silicon film lamination is obtained, the films can be prevented from peeling off. There is a case wherein polymer remains at the interface of the drain electrode 7 and the lower electrode 25 because of an etching gas, and contaminates the interface. However, relative to a contact resistance to the photodiode 100, the increase of a resistance of the contact between the drain electrode 7 and the lower electrode 25 is so little that a problem does not occur.

Since the manufacturing method performed after the amorphous silicon film lamination has been formed is the same as in the first embodiment, no further explanation for this will be described. As previously described, the feature of the second embodiment is that the photodiode 100 is located near the opening edge of the contact hole CH1 so as not to cross the portion where the lower electrode 25 covers the passivation film 8 (the portion 26 indicated by a broken line in FIG. 10). Therefore, as well as in the first embodiment, since laminated amorphous silicon layers that constitute the photodiode 100 do not include a portion that crosses the step difference, the satisfactory photodiode 100 having little current leakage can be obtained. In addition, when the lower electrode 25 is formed and the photodiode 100 is overlaid, peeling off of amorphous silicon films, which is caused by polymer that is attached during the process for opening the contact hole CH1, can be prevented.

(Third Embodiment)

In the second embodiment, the lower electrode 25 has been formed so that the pattern end completely covers the contact hole CH1. This is because of the following background. Assuming that the lower electrode 25 is smaller than the contact hole CH1, the drain electrode 7 underneath will be exposed by etching the lower electrode 25. In a case wherein the drain electrode 7 does not have etch selectivity relative to the lower electrode 25, the drain electrode 7 underneath would also be etched. Especially when the connection portion 7a of the drain electrode 7 is etched, a wire break will occur between the thin film transistor (TFT) and the photodiode 100. Therefore, etch selectivity relative to the drain electrode 7 is required for the material of the lower electrode 25, and the selection range of materials is narrowed. To avoid this problem, generally, the lower electrode 25 is formed larger than the contact hole CH1. That is, the lower electrode 25 is formed to cover the contact hole CH1.

When the lower electrode 25 is formed too large, however, the lower electrode 25 is located too close to the data line 14 and the capacitance between the wiring is increased. In order to reduce the inter-wiring capacitance, a small lower electrode 25 is preferable. Accordingly, the dimension of the photodiode 100 should be reduced; however, this is difficult, because the reduction of the dimension of the photodiode 100 lowers the sensitivity of the photosensor. Therefore, under these circumstances, the lower electrode 25 is arranged as close as possible to the opening edge of the contact hole CH1. When alignment offset of the patterns has occurred, the pattern end of the lower electrode 25 might enter inside of the contact hole CH1. In this case, the above described problem on selection of the material for the lower electrode 25 also occurs. A third embodiment of this invention resolves this problem.

Figure 11:
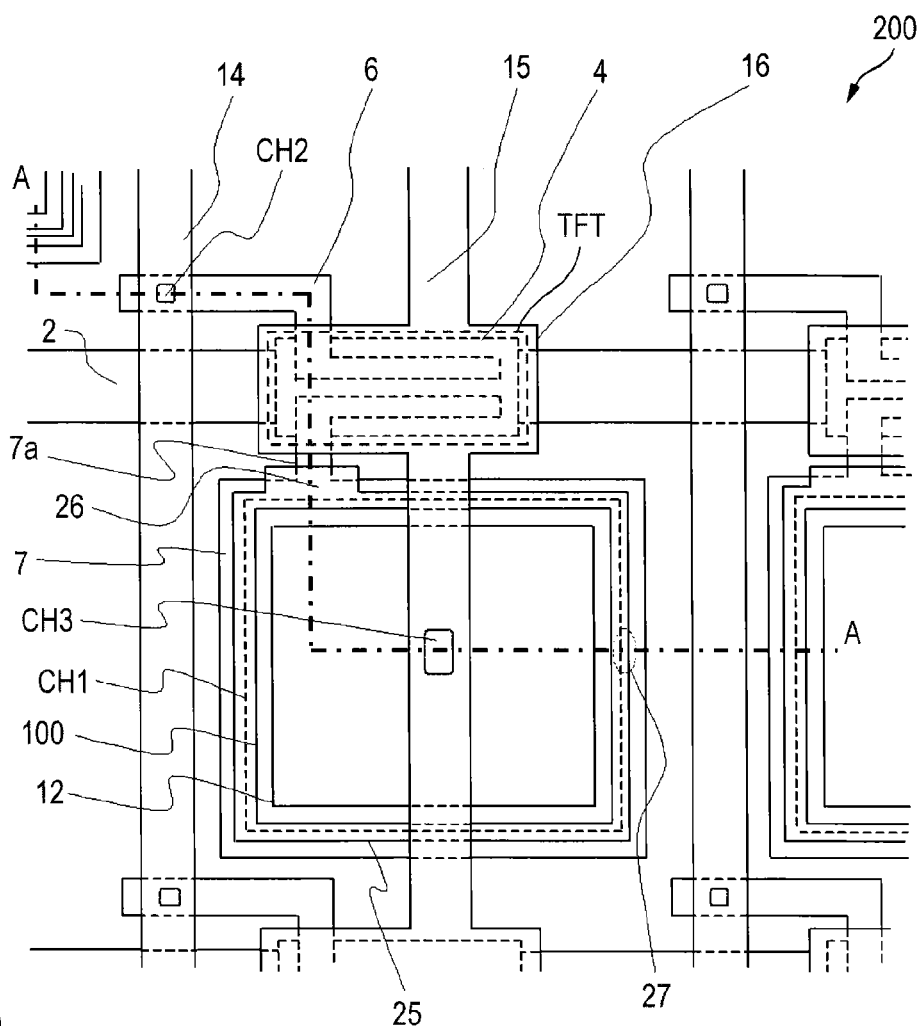
FIG. 11 is a plan view of a TFT array substrate provided for a photosensor according to a third embodiment of the preset invention.
Figure 12:
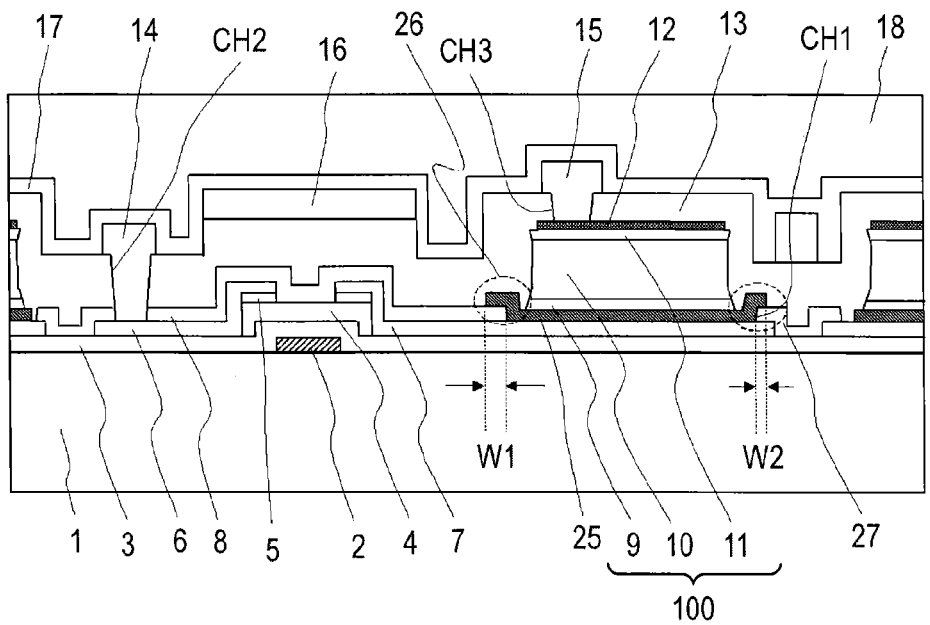
FIG. 12 is a cross-sectional view of the TFT array substrate provided for the photosensor according to the third embodiment.

A plan view and a cross-sectional view of a TFT array substrate 200 for the third embodiment are shown in FIGS. 11 and 12. FIG. 12 is a cross-sectional view of a portion indicated by A-A in FIG. 11. Referring to FIG. 12, in addition to the portion 26 in the second embodiment, a portion 27 is also shown as an area, near the opening edge of the contact hole CH1, where the lower electrode 25 covers the passivation film 8. The feature of the third embodiment is that a distance of the portion 26 where the lower electrode 25 overlaps the passivation film 8, i.e., an overlap distance W1, is greater than an overlap distance W2 of the portion 27 where the lower electrode 25 overlaps the passivation film 8.

As shown in FIG. 11, the portion 26 is an area corresponding to the connection portion 7a where a TFT and the photodiode 100 are connected together. Therefore, a relationship of the overlap distances in FIG. 12 can be rephrased as follows. In the third embodiment, the TFT array substrate 200 is formed, so that the overlap distance W1 for the connection portion 7a is greater than the overlap distance W2 for the area other than the connection portion 7a. Thus, the increase of the capacitance imposed on the data line 14 can be minimized, and when a defect, such as alignment offset, has occurred during the manufacturing processing, a wire break is rarely caused at the connection portion 7a. These effects are increased especially when the same material is employed for the lower electrode 25 and the drain electrode 7 to improve the productivity, or when only an electrode material having an inappropriate etch selectivity is available to be employed. The method for manufacturing the TFT array substrate 200 of the third embodiment is the same as the method of the second embodiment, except for a mask pattern used at the step of patterning the lower electrode 25 and the contact hole CH1. Therefore, no further explanation for this will be given.

Further, in the third embodiment, the photodiode 100 includes a P-doped amorphous silicon film 9, an intrinsic amorphous silicon film 10 and a B-doped amorphous silicon film 11, and is arranged so as not to cross a step difference formed by the contact hole CH1, the drain electrode 7 or the lower electrode 25. Therefore, the effects provided by the first embodiment can also be obtained. In addition, as well as in the second embodiment, the bond lift-off of the P-doped amorphous silicon film 9, the intrinsic amorphous silicon film 10 and the B-doped amorphous silicon film 11 can be prevented.

(Fourth Embodiment)

In the third embodiment, an overlap portion has been increased at the connection portion 7a, compared with the portion other than the connection portion 7a in order to prevent a wire break that may be caused at the connection portion 7a at the occurrence of an alignment error. A difference of a fourth embodiment from the third embodiment is that an area other than the connection portion 7a includes a portion where the pattern end of a lower electrode 25 is positioned inside a contact hole CH1. With this arrangement, a capacitance imposed on a data line 14 can be more reduced.

Figure 13:
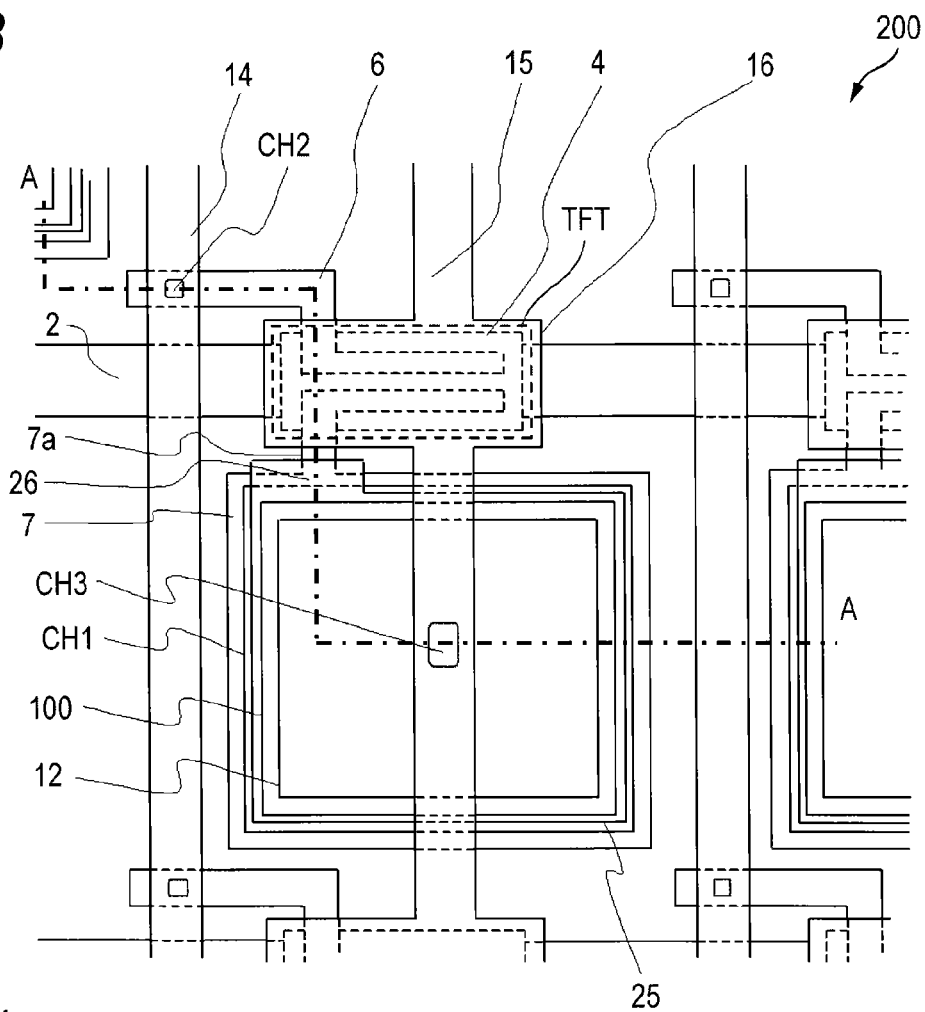
FIG. 13 is a plan view of a TFT array substrate provided for a photosensor according to a fourth embodiment of the preset invention.
Figure 14:
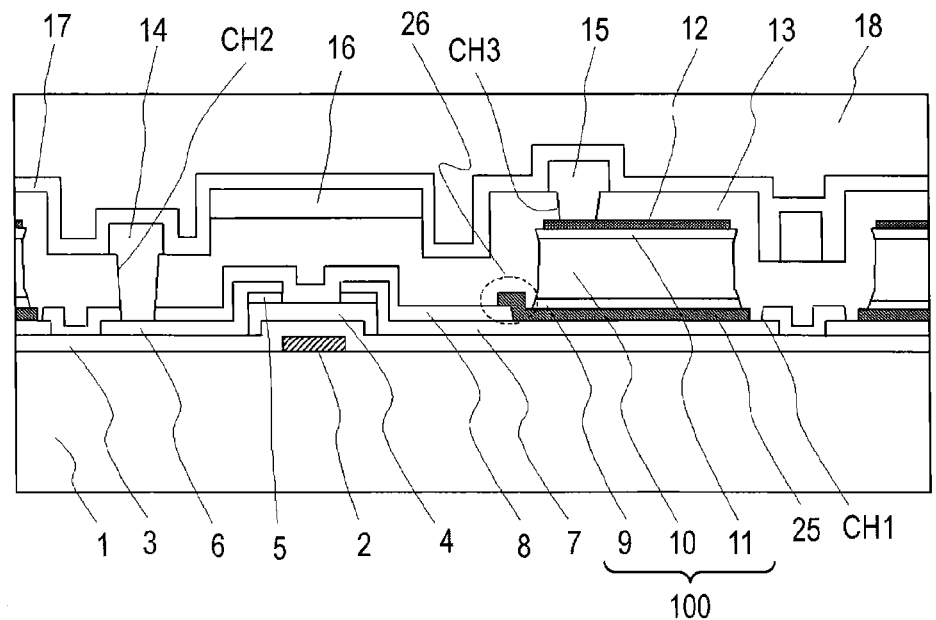
FIG. 14 is a cross-sectional view of the TFT array substrate provided for the photosensor according to the fourth embodiment.

A plan view and a cross-sectional view of a TFT array substrate 200 according to the forth embodiment are shown in FIGS. 13 and 14. FIG. 14 is a cross-sectional view of a portion indicated by A-A in FIG. 13. Referring to FIG. 13, in the whole area other than the connection portion 7a, the pattern end of the lower electrode 25 is positioned inside the contact hole CH1. However, the arrangement is not limited to this.

That is, in an area other than the connection portion 7a, the positional relation of the contact hole CH1 and the lower electrode 25 may be locally reversed, and both a portion where the lower electrode 25 and a passivation film 8 overlap and a portion where these components do not overlap may be present. For example, only in a portion near the wiring, such as the data line 14, the pattern end of the lower electrode may be positioned inside the contact hole CH1. A manufacturing method for the fourth embodiment is the same as for the second embodiment, except for a mask pattern used at the step for patterning the lower electrode 25 and the contact hole CH1, and no further explanation for this will be given. As previously described, since a drain electrode 7 is exposed during the process for etching the lower electrode 25, it is preferable that a material that has etch selectivity relative to the drain electrode 7 be employed for the lower electrode 25.

Figure 15:
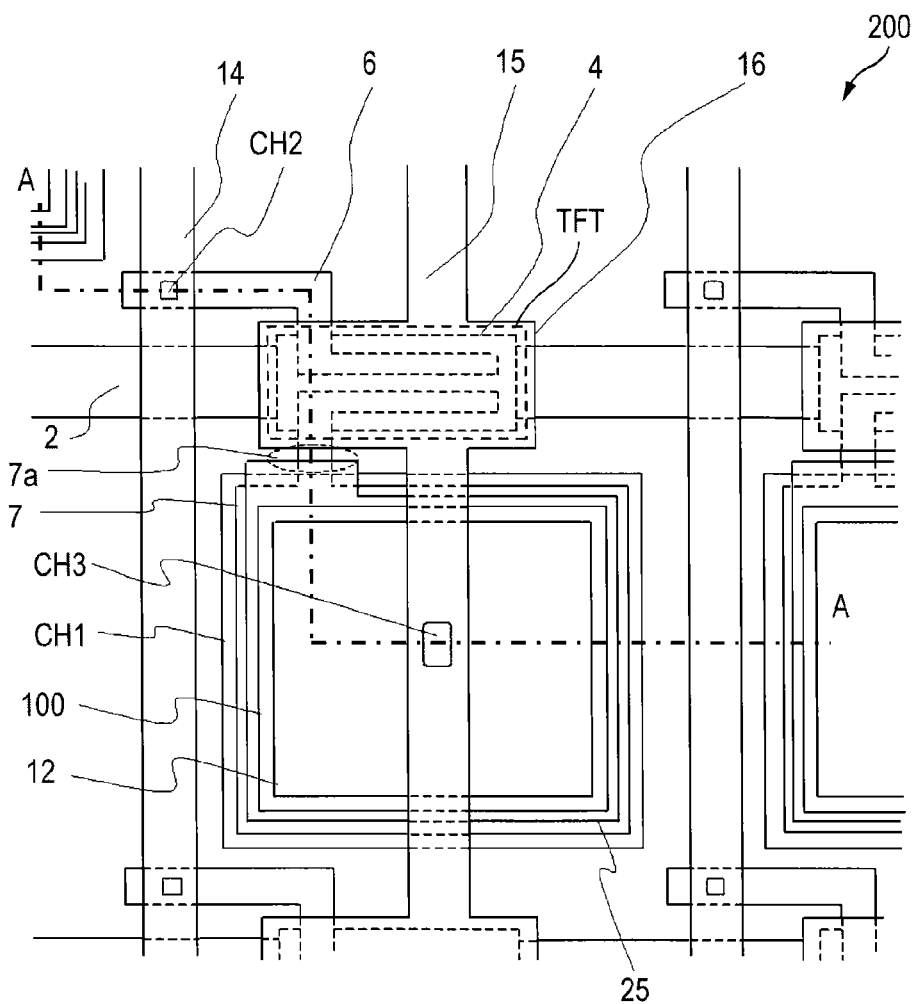
FIG. 15 is a plan view of a TFT array substrate provided for a photosensor in a different example for the fourth embodiment.
Figure 16:
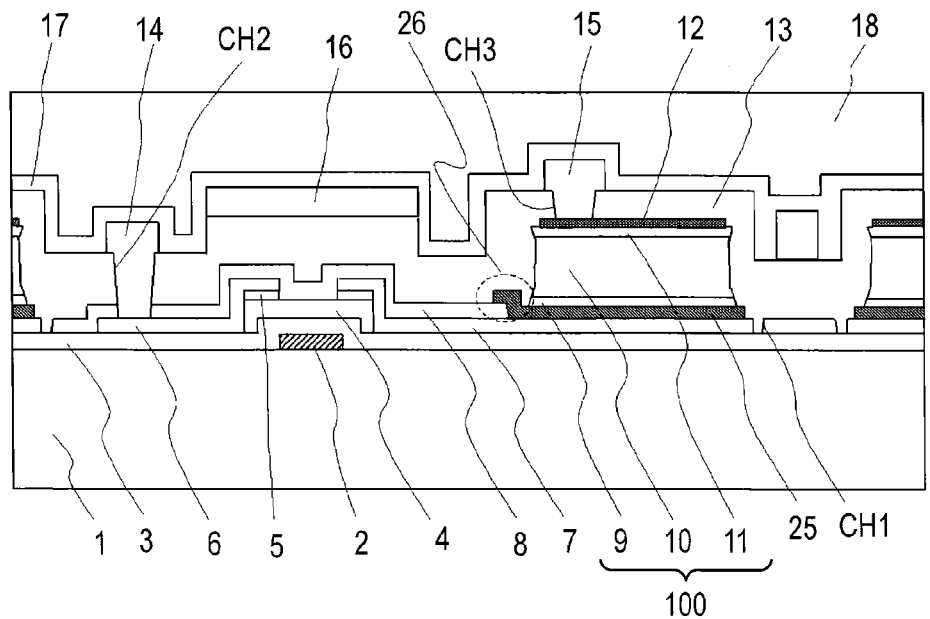
FIG. 16 is a cross-sectional view of the TFT array substrate provided for the photosensor in the different example for the fourth embodiment.

Furthermore, the opening edge of the contact hole CH1 is enclosed by the pattern end of the drain electrode 7. However, this positional relationship may be reversed. A plan view and a cross sectional view of a TFT array substrate 200 with a reversed arrangement are shown in FIGS. 15 and 16. FIG. 16 is a cross-sectional view of a portion indicated by A-A in FIG. 15. In FIG. 15, the drain electrode 7 is enclosed by the opening edge of the contact hole CH1, and the lower electrode 25 is arranged to have the same size as the drain electrode 7, or to enclose the drain electrode 7. Also in this case, a photodiode 100 that includes a P-doped amorphous silicon film 9, an intrinsic amorphous silicon film 10 and a B-doped amorphous silicon film 11 is formed so as not to cross a step difference formed by the contact hole CH1, the drain electrode 7 or the lower electrode 25. Therefore, the effects of the invention can be obtained. Further, bond lift-off of the P-doped amorphous silicon film 9, the intrinsic amorphous silicon film 10 and the B-doped amorphous silicon film 11 can be prevented. Since the manufacturing method is almost the same as that described above, except for the size of a mask used to open the contact hole CH1, no further explanation for it will be given. It is preferable, however, that the etching process for opening the contact hole CH1 be performed under an etching condition providing etch selectivity for the gate insulating film 3 located underneath.

(Fifth Embodiment)

In the first embodiment, the photodiode 100 is enclosed by the opening edge of the contact hole CH1 and the drain electrode 7 in order to provide the photodiode 100 having little current leakage. In the second to fourth embodiments, the photodiode 100 is enclosed by the lower electrode 25 on the assumption that the photodiode 100 is arranged inside the opening edge of the contact hole CH1. However, these arrangements of the photodiode 100 must be designed by considering, at least, at the photolithography step, two alignment margins, i.e., an alignment margin between the contact hole CH1 and the drain electrode 7 and an alignment margin between the contact hole CH1 and the photodiode 100, and the final uniformity of three components, i.e., the contact hole CH1, the drain electrode 7 and the photodiode 100. Therefore, there is a case wherein the dimension of the photodiode 100 is reduced and the open area ratio is lowered.

Figure 17:
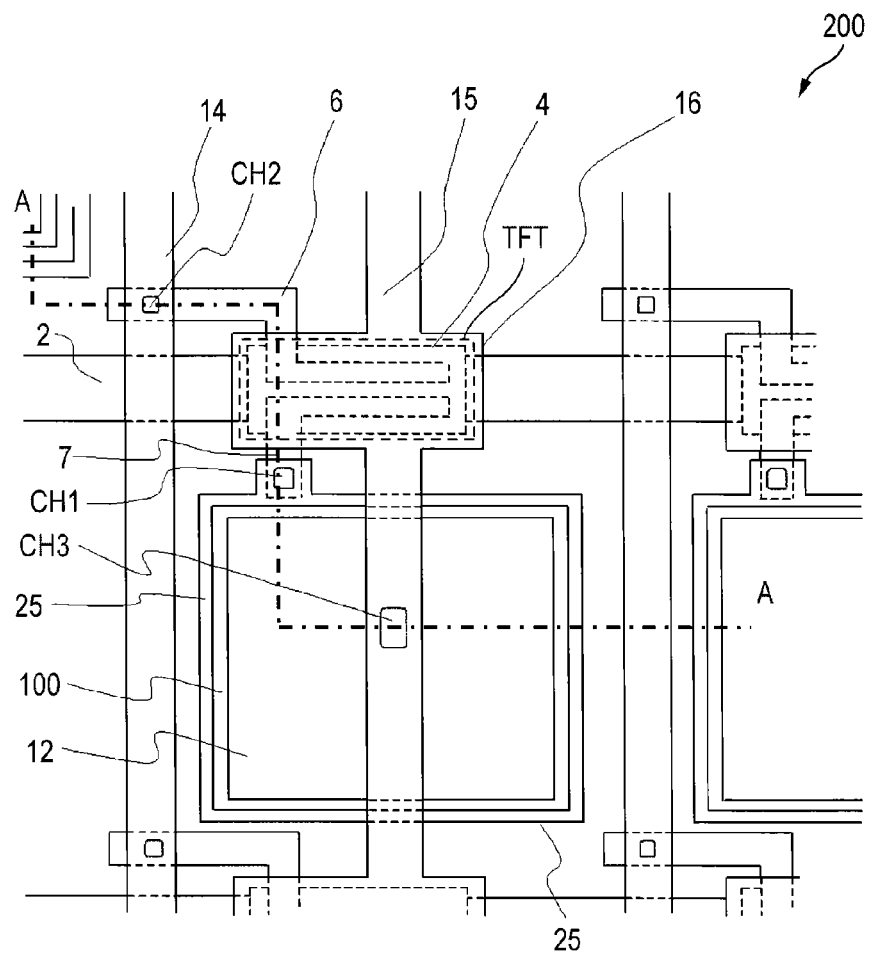
FIG. 17 is a plan view of a TFT array substrate provided for a photosensor according to a fifth embodiment of the preset invention.
Figure 18:
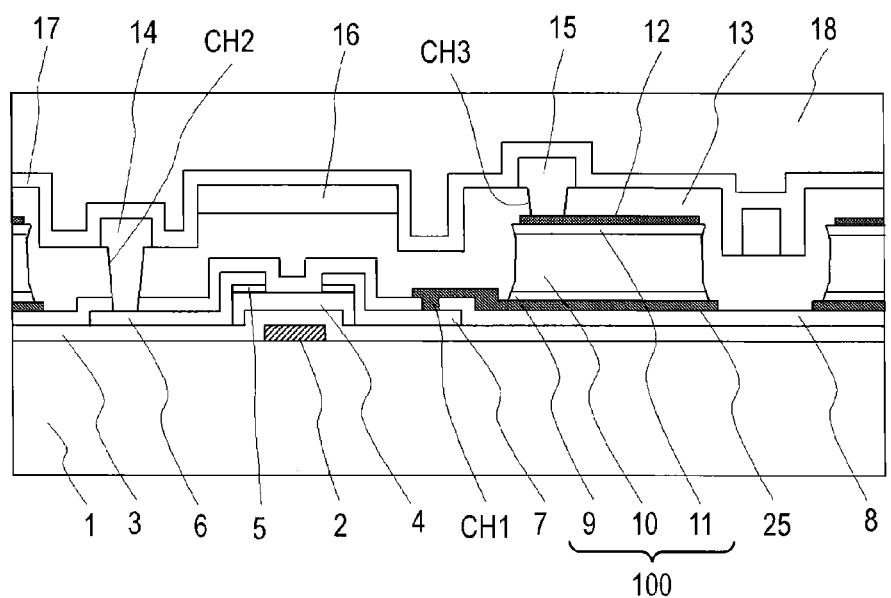
FIG. 18 is a cross-sectional view of the TFT array substrate provided for the photosensor according to the fifth embodiment.

According to a fifth embodiment of the invention, a leak current of a photodiode 100 can be inhibited, and peeling off of amorphous silicon films can be prevented without reducing an open area ratio. This embodiment will now be described while referring to FIGS. 17 and 18. FIG. 17 is a plan view of a TFT array substrate 200 provided for a photosensor according to this embodiment. FIG. 18 is a cross-sectional view of a portion indicated by A-A in FIG. 17.

A manufacturing method for the fifth embodiment is the same as the second embodiment, except for a process for forming a drain electrode 7, the position where a contact hole CH1 is open and the size of a mask used to forma lower electrode 25. Thus, no further explanation for the method will be given. Referring to FIG. 17, the feature of the fifth embodiment is that the contact hole CH1 that connects the drain electrode 7 to the lower electrode 25 does not enclose amorphous silicon film lamination that serves as a photodiode 100, and is formed at a position different from that of the photodiode 100. Further, since the amorphous silicon film lamination that serves as the photodiode 100 is arranged so as to be enclosed by the lower electrode 25, and since there is not an area that crosses a step difference formed by the drain electrode 7, the contact hole CH1 or the lower electrode 25, the photodiode 100 having little current leakage can be provided. With this arrangement, at the photolithography step for the photodiode 100, only an alignment margin between the photodiode 100 and the lower electrode 25 is required. Therefore, the alignment margin is reduced compared with that in the first or second embodiment, and the open area ratio can be increased. Further, since the amorphous silicon films are laminated on the lower electrode 25, peeling off of the amorphous silicon films can be prevented.

A TFT of reverse stagger channel etch type that employs amorphous silicon has been employed for this embodiment. However, a polysilicon TFT or an MOS using crystal silicon may also be employed. Or, a device having a switching function and a photodiode may be employed together.

An array substrate obtained by the above method can be employed to produce a photosensor, such as X-ray image pickup apparatus as shown in FIG. 20, using a well known method. Although not shown, a scintillator, such as a CsI, that converts X rays into visible light is formed, by vapor deposition, on or above the fourth passivation film 18 in FIG. 2, and a digital board, on which a low noise amplifier and an A/D converter are mounted, a driver board that drives a TFT and a reading board that reads electric charges are connected to the photosensor as shown in FIG. 19. In this manner, an X-ray image pickup apparatus can be prepared.

What is claimed is:

1. A photosensor comprising:
a thin film transistor (TFT) array substrate of an active matrix type, on which a photodiode and a thin film transistor are arranged in a matrix, wherein
the thin film transistor includes
a plurality of gate wiring lines each having a gate electrode,
a semiconductor layer provided for the gate electrode via a gate insulating film, and
a source electrode and a drain electrode connected to the semiconductor layer,
the TFT array substrate includes
a passivation film deposited on the thin film transistor, the source electrode, and the drain electrode,
a contact hole opened through the passivation film, and
a photodiode arranged in the contact hole and connected to the drain electrode via a lower electrode, the photodiode being encompassed by a boundary between the passivation film and the contact hole, and the photodiode being spaced from the passivation film,
a lower layer of the photodiode is substantially flat, and
the lower electrode formed in the contact hole so as to be connected to the drain electrode.

2. The photosensor according to claim 1, wherein the lower electrode is formed to cover an opening edge of the contact hole.

3. The photosensor according to claim 1, wherein
the drain electrode includes a connection portion that is located between an area on the semiconductor layer and an area where the photodiode is formed and that connects those two areas, and
an overlap distance of the connection portion where the lower electrode covers the contact hole is greater than an overlap distance of a portion, other than the connection portion, where the lower electrode covers the contact hole.

4. The photosensor according to claim 1, wherein
the drain electrode includes a connection portion that is located between an area on a semiconductor layer and an area where the photodiode is formed and that connects those two areas, and
a portion other than the connection portion includes a portion where the lower electrode is positioned inside an opening edge of the contact hole.

5. The photosensor according to claim 1, wherein a step difference is absent from an area where the photodiode is formed.

6. The photosensor according to claim 1, wherein a metal used to form the gate electrode includes at least one of aluminum and copper as a primary element.

7. The photosensor according to claim 6, wherein the metal that includes aluminum as the primary element is one of AlNiNd, AlNiSi, and AlNiMg.

8. The photosensor according to claim 1, further comprising:
a scintillator formed above the passivation film;
a digital board is connected to the source electrode, the digital board including a low noise amplifier and an analog-to-digital (A/D) converter connected to the low noise amplifier, and
a driver board connected to the gate electrode and configured to drive the thin film transistor.

9. The photosensor according to claim 8, wherein the scintillator converts X rays into visible light to provide a function for displaying an X ray image.

10. The photosensor according to claim 1, wherein the photodiode is encompassed by a boundary among the passivation film, the drain electrode, and the contact hole.

11. The photosensor according to claim 1, wherein the photodiode is overlapped by the drain electrode and the lower electrode in a top plan view.

12. The photosensor according to claim 1, wherein a whole of the photodiode is overlapped with the drain electrode and the lower electrode in a top plan view.

13. The photosensor according to claim 1, wherein the drain electrode and the lower electrode are directly in contact with each other.

* * * * *